US010580578B1

(12) United States Patent
Choi et al.

(10) Patent No.: US 10,580,578 B1
(45) Date of Patent: *Mar. 3, 2020

(54) MULTILAYER CERAMIC ELECTRONIC COMPONENT HAVING EXTERNAL ELECTRODE LAYERS WITH HOLES

(71) Applicant: SAMSUNG ELECTRO-MECHANICS CO., LTD., Suwon-si, Gyeonggi-do (KR)

(72) Inventors: Hye Young Choi, Suwon-si (KR); Jong Ho Lee, Suwon-si (KR); Eui Hyun Jo, Suwon-si (KR); Jang Yeol Lee, Suwon-si (KR); Jin Woo Lee, Suwon-si (KR); Hyun Hee Gu, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/372,782

(22) Filed: Apr. 2, 2019

Related U.S. Application Data

(63) Continuation of application No. 16/186,008, filed on Nov. 9, 2018, now Pat. No. 10,373,759.

(30) Foreign Application Priority Data

Sep. 5, 2018 (KR) .................. 10-2018-0105915

(51) Int. Cl.
H01G 4/232 (2006.01)
H01G 4/30 (2006.01)
H05K 1/18 (2006.01)

(52) U.S. Cl.
CPC ............. H01G 4/232 (2013.01); H01G 4/30 (2013.01); H05K 1/181 (2013.01); H05K 2201/10636 (2013.01)

(58) Field of Classification Search
CPC ........ H01G 4/232; H01G 4/30; H01G 4/1227; H01G 4/008
See application file for complete search history.

(56) References Cited

U.S. PATENT DOCUMENTS

2013/0063862 A1 3/2013 Kim
2015/0116901 A1 4/2015 Sasaoka
(Continued)

FOREIGN PATENT DOCUMENTS

CN 104867673 A 8/2015
CN 107316742 A 11/2017
(Continued)

OTHER PUBLICATIONS

Non-Final Office Action issued in corresponding U.S. Appl. No. 16/186,008 dated Feb. 5, 2019.
(Continued)

Primary Examiner — David M Sinclair
(74) Attorney, Agent, or Firm — Morgan, Lewis & Bockius LLP

(57) ABSTRACT

A multilayer ceramic electronic component includes a ceramic body including dielectric layers and first and second internal electrodes alternately stacked with each of the dielectric layers interposed therebetween. First and second external electrodes are disposed on outer surfaces of the ceramic body, connected to the first and second internal electrodes respectively, and disposed to cover at least five of eight corners of the ceramic body. The first and second external electrodes include, respectively, first and second base electrode layers at least partially in contact with the outer surfaces of the ceramic body and first and second plating layers disposed to cover the first and second base electrode layers, respectively. The first and second plating or base electrode layers have one or more to three or less holes (Continued)

positioned adjacent to one or more to three or less of the eight corners of the ceramic body.

16 Claims, 6 Drawing Sheets

(56) References Cited

U.S. PATENT DOCUMENTS

| | | |
|---|---|---|
| 2015/0243439 A1 | 8/2015 | Kwag |
| 2016/0099108 A1* | 4/2016 | Koide .................. H01G 4/30 361/301.4 |
| 2016/0293331 A1* | 10/2016 | Kitamura ............... H01G 4/30 |
| 2017/0294268 A1 | 10/2017 | Katsuta |
| 2017/0301464 A1 | 10/2017 | Terashita |
| 2017/0301469 A1 | 10/2017 | Juhng et al. |
| 2017/0330689 A1 | 11/2017 | Hatanaka |
| 2018/0090274 A1 | 3/2018 | Ito et al. |

FOREIGN PATENT DOCUMENTS

| | | |
|---|---|---|
| JP | 2004-289089 A | 10/2004 |
| JP | 2007-13029 A | 1/2007 |
| JP | 2007-234774 A | 9/2007 |
| JP | 2008-251990 A | 10/2008 |
| JP | 2008-300769 A | 12/2008 |
| JP | 2009-158662 A | 7/2009 |
| JP | 2009-218353 A | 9/2009 |
| JP | 2015-84360 A | 4/2015 |
| JP | 2015-103554 A | 6/2015 |
| JP | 2017-011172 A | 1/2017 |
| KR | 2018-0035170 A | 4/2018 |

OTHER PUBLICATIONS

Office Action issued in corresponding Chinese Patent Application No. 201910005136.4 dated Jan. 2, 2020, with English translation.

* cited by examiner

MULTILAYER CERAMIC ELECTRONIC COMPONENT HAVING EXTERNAL ELECTRODE LAYERS WITH HOLES

CROSS-REFERENCE TO RELATED APPLICATION(S)

This application is the Continuation of U.S. patent application Ser. No. 16/186,008 filed Nov. 9, 2018, which claims benefit of priority to Korean Patent Application No. 10-2018-0105915 filed on Sep. 5, 2018 in the Korean Intellectual Property Office, the disclosures of which are incorporated herein by reference in its entirety.

BACKGROUND

1. Field

The present disclosure relates to a multilayer ceramic electronic component.

2. Description of Related Art

Multilayer ceramic electronic components are widely used as an information technology (IT) components in computers, personal digital assistants (PDAs), cellular phones, and the like. The multilayer ceramic electronic components can have a small size while implementing high capacitance, may be easily mounted, and have been widely used as electrical components in view of their high reliability and high durability characteristics.

An external electrode included in a multilayer ceramic electronic component is an electrode exposed externally of the multilayer ceramic electronic component, and has a significant influence on reliability and durability of the multilayer ceramic electronic component.

Recently, in accordance with miniaturization and functionality improvements of multilayer ceramic electronic components, a thickness of external electrodes has gradually decreased. However, as the thickness of external electrodes is decreased, reliability and durability of the external electrode may also be decreased.

SUMMARY

As a thickness of an external electrode is decreased, a plating layer and/or abase electrode layer included in the external electrode may have holes positioned at points corresponding to eight corners of a ceramic body.

An aspect of the present disclosure may provide a multilayer ceramic electronic component in which a thickness of the external electrode may be decreased and deterioration of water proof reliability and a mounting defective rate of the external electrode may be substantially suppressed, by optimizing the number of holes.

According to an aspect of the present disclosure, a multilayer ceramic electronic component may include a ceramic body including dielectric layers and first and second internal electrodes alternately stacked in a thickness direction and respectively exposed to one opposing surfaces of the ceramic body with each of the dielectric layers interposed therebetween. First and second external electrodes are disposed on outer surfaces of the ceramic body to be connected to the first and second internal electrodes, respectively, and disposed to cover at least five of eight corners of the ceramic body. The first and second external electrodes include, respectively, first and second base electrode layers at least partially in contact with the outer surfaces of the ceramic body and first and second plating layers disposed to cover the first and second base electrode layers, respectively. The first and second plating layers have one or more to three or less holes positioned adjacent to one or more to three or less of the eight corners of the ceramic body.

According to another aspect of the present disclosure, a multilayer ceramic electronic component may include a ceramic body including dielectric layers and first and second internal electrodes alternately stacked in a thickness direction and respectively exposed to opposing end surfaces of the ceramic body with each of the dielectric layers interposed therebetween. First and second external electrodes are disposed on outer surfaces of the ceramic body to be connected to the first and second internal electrodes, respectively, and disposed to cover at least five of eight corners of the ceramic body. The first and second external electrodes include, respectively, first and second base electrode layers at least partially in contact with the outer surfaces of the ceramic body and first and second plating layers disposed to cover the first and second base electrode layers, respectively. The first and second base electrode layers have one or more to three or less holes positioned adjacent to the eight corners of the ceramic body.

According to a further aspect of the present disclosure, a multilayer ceramic electronic component may include a ceramic body including alternately stacked first and second internal electrodes with dielectric layers therebetween, and first and second external electrodes disposed on respective opposing end surface of the ceramic body through which the first and second internal electrodes are respectively exposed, and extending on four side surfaces of the ceramic body adjacent to the opposing end surfaces. The first and second external electrodes are disposed on at least five of eight corners of the ceramic body. Each of the first and second external electrodes includes a base electrode layer in contact with the respective end surface and the four side surfaces of the ceramic body, and a plating layer covering the base electrode layer, and at least one of the base electrode layers and the plating layers of the first and second external electrodes includes one or more and three or less holes extending therethrough.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
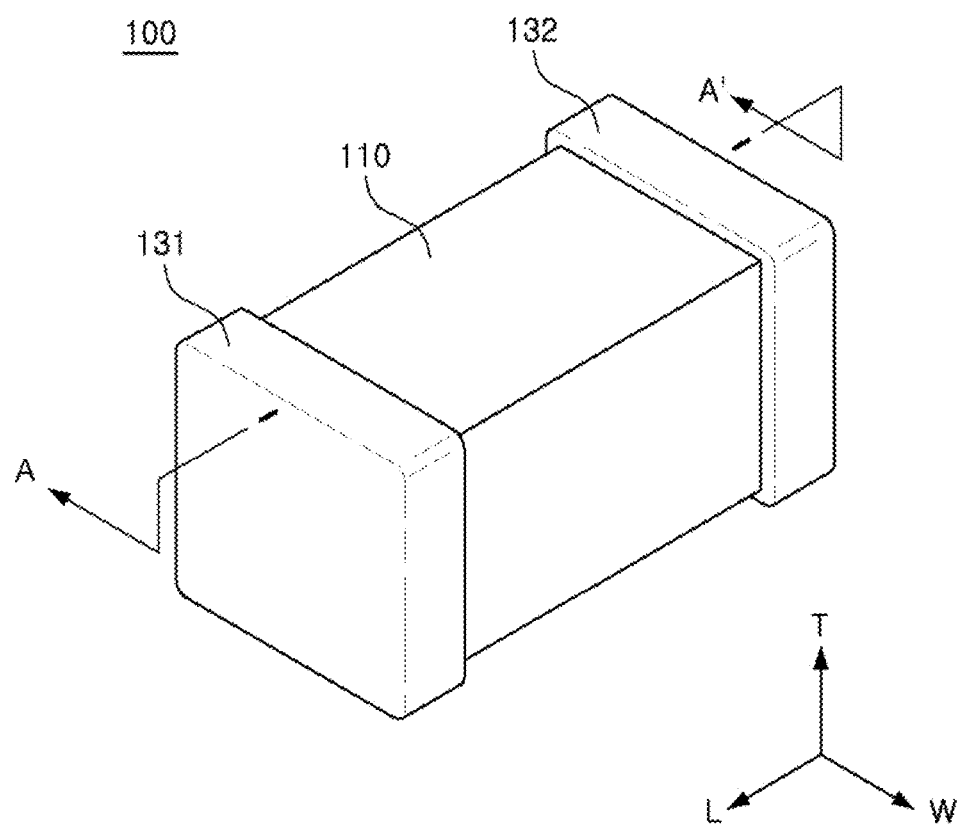
FIG. 1 is a perspective view illustrating a multilayer ceramic electronic component according to an exemplary embodiment.

Hereinafter, exemplary embodiments will now be described in detail with reference to the accompanying drawings.

Directions of a hexahedron will be defined in order to clearly describe exemplary embodiments in the present disclosure. L, W and T illustrated in the drawings refer to a length direction, a width direction, and a thickness direction, respectively. Here, the thickness direction refers to a stacking direction in which dielectric layers are stacked.

A multilayer ceramic electronic component according to an exemplary embodiment, particularly a multilayer ceramic capacitor, will hereinafter be described. However, the multilayer ceramic electronic component according to the present disclosure is not limited thereto.

Figure 2:
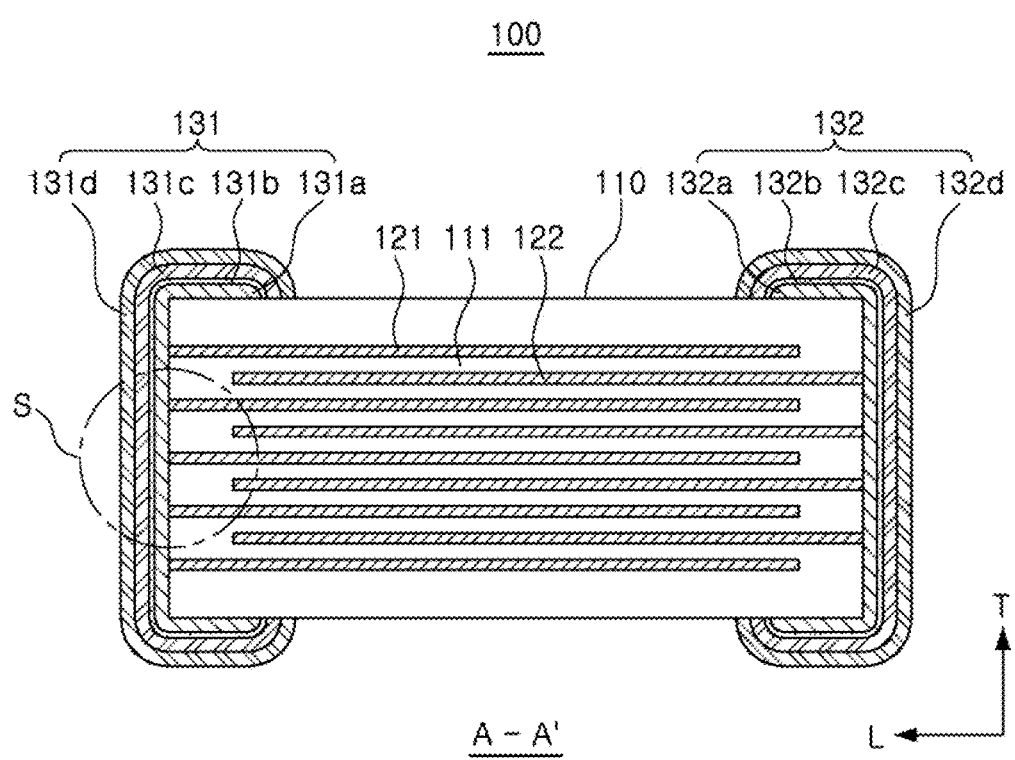
FIG. 2 is a cross-sectional view taken along line A-A' of FIG. 1.
Figure 3:
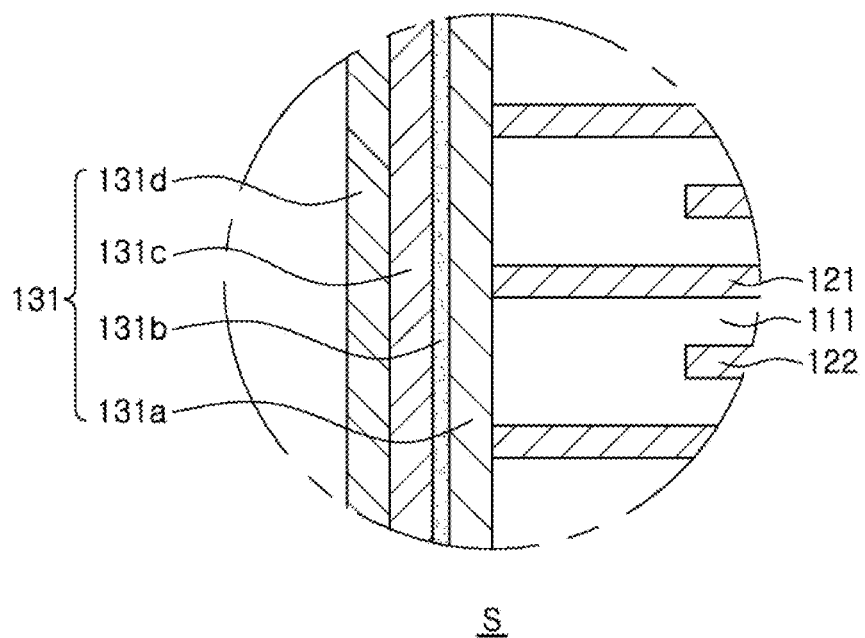
FIG. 3 is an enlarged view of region S of FIG. 2.

FIG. 1 is a perspective view illustrating a multilayer ceramic electronic component according to an exemplary embodiment, FIG. 2 is a cross-sectional view taken along line A-A' of FIG. 1, and FIG. 3 is an enlarged view of region S of FIG. 2.

Referring to FIGS. 1 through 3, a multilayer ceramic electronic component 100 according to an exemplary embodiment may include a ceramic body 110, and first and second external electrodes 131 and 132.

The ceramic body 110 may be formed of a hexahedron having end surfaces opposite each other in a length direction L, side surfaces opposite each other in a width direction W, and side surfaces opposite each other in a thickness direction T. The ceramic body 110 may be formed by stacking a plurality of dielectric layers 111 in the thickness direction T and then sintering the plurality of dielectric layers 111. A shape and a dimension of the ceramic body 110 and the number (one or more) of stacked dielectric layers 111 are not limited to those illustrated in the present exemplary embodiment.

The plurality of dielectric layers 111 disposed in the ceramic body 110 may be in a sintered state, and adjacent dielectric layers 111 may be integrated with each other so that boundaries therebetween are not readily apparent without using a scanning electron microscope (SEM).

The ceramic body 110 may have a form in which eight corners of the hexahedron are round. Therefore, durability and reliability of the ceramic body 110 may be improved, and structural reliability of the first and second external electrodes 131 and 132 at the corners may be improved.

The dielectric layers 111 may have a thickness arbitrarily changed in accordance with a capacitance design of the multilayer ceramic electronic component 100, and may include ceramic powders having a high dielectric constant, such as barium titanate ($BaTiO_3$)-based powders or strontium titanate ($SrTiO_3$)-based powders. However, a material of the dielectric layer 111 according to the present disclosure is not limited thereto. In addition, various ceramic additives, organic solvents, plasticizers, binders, dispersants, and the like, may be added to the ceramic powders according to an object of the present disclosure.

An average particle size of the ceramic powders used to form the dielectric layer 111 is not particularly limited, and may be controlled in order to accomplish an object of the present disclosure. For example, the average particle size of the ceramic powders used to form the dielectric layer 111 may be controlled to be 400 nm or less. Therefore, the multilayer ceramic electronic component 100 according to an exemplary embodiment in the present disclosure may be used as a component that can be miniaturized and have a high capacitance, such as an information technology (IT) component.

For example, the dielectric layers 111 may be formed by applying and then drying slurry including powders such as barium titanate ($BaTiO_3$) powders, or the like, to carrier films to prepare a plurality of ceramic sheets. The ceramic sheets may be formed by mixing ceramic powders, a binder, and a solvent with one another to prepare slurry and manufacturing the slurry in a sheet shape having a thickness of several micrometers by a doctor blade method, but are not limited thereto.

First and second internal electrodes 121 and 122 may include at least one first internal electrode 121 and at least one second internal electrode 122 having different polarities, and may be formed at predetermined thicknesses with each of the plurality of dielectric layers 111 stacked in the thickness direction T of the ceramic body 110 interposed therebetween.

The first internal electrodes 121 and the second internal electrodes 122 may be formed to be respectively exposed to one end surface and the other end surface of the ceramic body 110 in the length direction L of the ceramic body 110 in the stack direction of the dielectric layers 111 by printing a conductive paste including a conductive metal, and may be electrically insulated from each other by each of the dielectric layers 111 disposed therebetween. The first internal electrodes 121 and the second internal electrodes 122 may be alternately stacked with the dielectric layers 111 therebetween in the ceramic body 110.

That is, the first and second internal electrodes 121 and 122 may be electrically connected to the first and second external electrodes 131 and 132, respectively, formed on opposite end surfaces of the ceramic body 110 in the length direction L of the ceramic body 110 through portions alternately exposed to the opposite end surfaces of the ceramic body 110 in the length direction of the ceramic body 110.

For example, the first and second internal electrodes 121 and 122 may include metal powders having an average particle size of 0.1 to 0.2 µm, and may be formed of a conductive paste for an internal electrode including 40 to 50 wt % of conductive metal powders, but are not limited thereto.

The conductive paste for an internal electrode may be applied to the ceramic sheets by a printing method, or the like, to form internal electrode patterns. A method of printing the conductive paste may be a screen printing method, a gravure printing method, or the like, but is not limited thereto. Two hundred or three hundred ceramic sheets on which the internal electrode patterns are printed may be stacked, pressed, and sintered to manufacture the ceramic body 110.

Therefore, when voltages are applied to the first and second external electrodes 131 and 132, electric charges may be accumulated between the first and second internal electrodes 121 and 122 facing each other. In this case, a capacitance of the multilayer ceramic capacitor 100 may be in proportion to an area of a region in which the first and second internal electrodes 121 and 122 overlap each other.

That is, when the area of the region in which the first and second internal electrodes 121 and 122 overlap each other is significantly increased, a capacitance may be significantly increased even in a capacitor having the same size.

Widths of the first and second internal electrodes 121 and 122 may be determined depending on the purpose, and may be, for example, 0.4 μm or less. Therefore, the multilayer ceramic electronic component 100 according to an exemplary embodiment in the present disclosure may be used as a component that can be miniaturized and have a high capacitance, such as an information technology (IT) component.

Since the thickness of the dielectric layer 111 corresponds to an interval between the first and second internal electrodes 121 and 122, the smaller the thickness of the dielectric layer 111, the greater the capacitance of the multilayer ceramic electronic component 100.

Meanwhile, the conductive metal included in the conductive paste forming the first and second internal electrodes 121 and 122 may be nickel (Ni), copper (Cu), palladium (Pd), silver (Ag), lead (Pb), or platinum (Pt), or alloys thereof. However, the conductive metal according to the present disclosure is not limited thereto.

The first and second external electrodes 131 and 132 may be disposed on outer surfaces of the ceramic body 110 to be connected to the first and second internal electrodes 121 and 122, respectively. The first external electrode 131 may be configured to electrically connect the first internal electrodes 121 and a board to each other, and the second external electrode 132 may be configured to electrically connect the second internal electrodes 122 and the board to each other.

The first and second external electrodes 131 and 132 may include, respectively, first and second plating layers 131c and 132c for the purpose of at least a portion of structural reliability, easiness in mounting the multilayer ceramic electronic component on the board, durability against external impact, heat resistance, and an equivalent series resistance (ESR).

For example, the first and second plating layers 131c and 132c may be formed by sputtering or electric deposition, but are not limited thereto.

For example, the first and second plating layers 131c and 132c may mainly contain nickel, but are not limited thereto, and may also be implemented by copper (Cu), palladium (Pd), platinum (Pt), gold (Au), silver (Ag), or lead (Pb), or alloys thereof.

The first and second external electrodes 131 and 132 may further include, respectively, first and second base electrode layers 131a and 132a disposed between the first and second internal electrodes 121 and 122 and the first and second plating layers 131c and 132c, respectively, and at least partially in contact with the outer surfaces of the ceramic body 110.

The first and second base electrode layers 131a and 132a may be relatively easily coupled to the first and second internal electrodes 121 and 122, respectively, as compared to the first and second plating layers 131c and 132c, and may thus decrease contact resistances against the first and second internal electrodes 121 and 122.

The first and second base electrode layers 131a and 132a may be disposed in inner regions relative to the first and second plating layers 131c and 132c in the first and second external electrodes 131 and 132, respectively.

For example, the first and second base electrode layers 131a and 132a may be covered (e.g., fully covered) by the first and second plating layers 131c and 132c and first and second conductive resin layers 131b and 132b, respectively, so as not to be exposed externally of the multilayer ceramic electronic component 100.

For example, the first and second base electrode layers 131a and 132a may be formed by a method of dipping the ceramic body 110 in a paste including a metal component or a method of printing a conductive paste including a conductive metal on at least one surface of the ceramic body 110 in the thickness direction T, and may also be formed by a sheet transfer method or a pad transfer method.

For example, the first and second base electrode layers 131a and 132a may be formed of copper (Cu), nickel (Ni), palladium (Pd), platinum (Pt), gold (Au), silver (Ag), or lead (Pb), or alloys thereof.

The first and second external electrodes 131 and 132 may further include, respectively, the first and second conductive resin layers 131b and 132b disposed between the first and second base electrode layers 131a and 132a and the first and second plating layers 131c and 132c, respectively.

Since the first and second conductive resin layers 131b and 132b have relatively high flexibility as compared to the first and second plating layers 131c and 132c, the first and second conductive resin layers 131b and 132b may protect the multilayer ceramic electronic component 100 from external physical impact or warpage impact of the multilayer ceramic electronic component 100, and may absorb stress applied to the external electrodes at the time of mounting the multilayer ceramic electronic component on the board or tensile stress to prevent a crack from being generated in the external electrodes.

For example, the first and second conductive resin layers 131b and 132b may have high flexibility and high conductivity by having a structure in which conductive particles such as copper (Cu), nickel (Ni), palladium (Pd), platinum (Pt), gold (Au), silver (Ag), or lead (Pb), are contained in a glass or a resin having high conductivity, such as an epoxy resin.

The first and second external electrodes 131 and 132 may further include, respectively, first and second tin plating layers 131d and 132d disposed on outer surfaces of the first and second plating layers 131c and 132c, respectively. The first and second tin plating layers 131d and 132d may further improve at least a portion of the structural reliability, the easiness in mounting the multilayer ceramic electronic component on the board, the durability against the external impact, the heat resistance, and the ESR.

Figure 4:
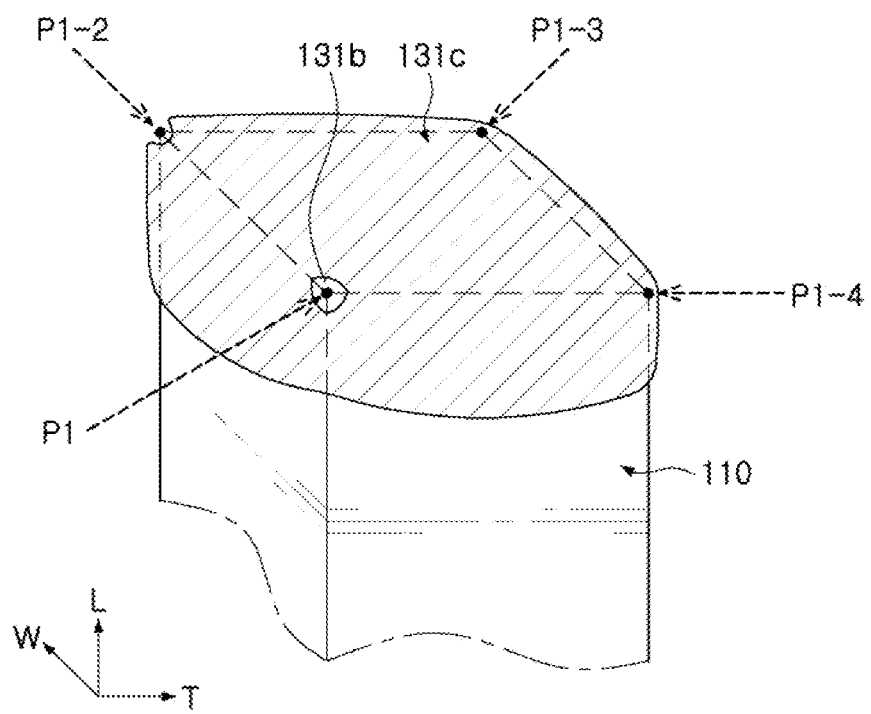
FIG. 4 is a perspective view illustrating corners of the multilayer ceramic electronic component according to an exemplary embodiment.

FIG. 4 is a perspective view illustrating corners of the multilayer ceramic electronic component according to an exemplary embodiment.

Referring to FIG. 4, the ceramic body 110 may include eight corners including corners P1, P1-2, P1-3, and P1-4.

The first and second plating layers 131c and 132c may be disposed to cover the eight corners including corners P1, P1-2, P1-3, and P1-4 of the ceramic body 110.

Each of the first and second plating layers 131c and 132c may have a thickness deviation.

For example, each of the first and second plating layers 131c and 132c may have the greatest thickness at the center of a [width×thickness] surface, and may have the smallest thickness at points thereof corresponding to the eight corners including corners P1, P1-2, P1-3, and P1-4.

Therefore, when an average thickness of each of the first and second plating layers 131c and 132c is gradually decreased, holes may be formed or occur at the points of the first and second plating layers 131c and 132c corresponding to the eight corners including corners P1, P1-2, P1-3, and P1-4. For example, holes may occur at points adjacent to, aligned with, or overlapping with the eight corners including corners P1, P1-2, P1-3, and P1-4. For instance, holes in close proximity to the eight corners including corners P1, P1-2, P1-3, and P1-4 may occur, such as holes disposed at a distance from a respective corner that is less than 10%, less than 5%, or less than 2% of a length of a side of the body of the multilayer component. The holes may overlap with or include the corners, such that corners are exposed through the holes.

The smaller the average thickness of each of the first and second plating layers 131c and 132c, the greater the likely size of each of the holes.

As the average thickness of each of the first and second plating layers 131c and 132c become small, the first and second plating layers 131c and 132c may improve reliability and warpage endurance of the multilayer ceramic electronic component against a cost of the multilayer ceramic electronic component.

The holes formed as the thickness of each of the first and second plating layers 131c and 132c becomes small may serve as an external moisture permeation path to decrease moistureproof reliability of the multilayer ceramic electronic component and decrease mounting reliability of the multilayer ceramic electronic component.

Therefore, when the thickness of each of the first and second plating layers 131c and 132 is optimized, the first and second plating layers 131c and 132c may not only secure the reliability and the warpage endurance of the multilayer ceramic electronic component against the cost of the multilayer ceramic electronic component, but may also secure the moistureproof reliability and the mounting reliability.

Since each of the first and second plating layers 131c and 132c may have a thickness deviation at the points thereof corresponding to the eight corners including corners P1, P1-2, P1-3, and P1-4, when the thickness of each of the first and second plating layers 131c and 132c is controlled so that holes are formed at only points of each of the first and second plating layers 131c and 132c corresponding to (e.g., aligned with, or overlapping with) some of the eight corners including corners P1, P1-2, P1-3, and P1-4 at the time of forming the first and second plating layers 131c and 132c, the thickness of each of the first and second plating layers 131c and 132c may be optimized.

Table 1 represents mounting reliability and moistureproof reliability depending on a frequency of hole forming at one of the eight corners including corners P1, P1-2, P1-3, and P1-4.

TABLE 1

| Number of Times of Measurement | Hole Forming Frequency | Mounting Defect Frequency | Moistureproof Reliability Defect Frequency |
|---|---|---|---|
| | | Design No. | |
| | 10 | 400 | 400 |
| 1 | 10 | 87 | 112 |
| 2 | 9 | 64 | 88 |
| 3 | 9 | 66 | 93 |
| 4 | 7 | 33 | 48 |
| 5 | 6 | 9 | 51 |
| 6 | 6 | 3 | 5 |
| 7 | 5 | 1 | 0 |
| 8 | 3 | 0 | 0 |
| 9 | 2 | 0 | 0 |
| 10 | 0 | 0 | 0 |

Referring to Table 1, when a hole forming frequency is less than 50%, a mounting defect and a moistureproof reliability defect may be prevented.

That is, when the thickness of each of the first and second plating layers 131c and 132c is controlled so that each of the first and second plating layers 131c and 132c has one or more to three or less holes positioned at the points thereof corresponding to the eight corners including corners P1, P1-2, P1-3, and P1-4, the mounting defect and the moistureproof reliability defect may be prevented.

For example, a thickness of each of the first and second external electrodes 131 and 132 at the center of the [width× thickness] surface may be controlled to be 10 μm or less.

Therefore, in the multilayer ceramic electronic component according to an exemplary embodiment, the reliability and the warpage endurance of the multilayer ceramic electronic component against the cost of the multilayer ceramic electronic component as well as the moistureproof reliability and the mounting reliability may be secured.

For example, a thickness of each of the first and second plating layers 131c and 132c at the center of the [width× thickness] surface may be controlled to be 3 μm or more to 5 μm or less.

Therefore, in the multilayer ceramic electronic component according to an exemplary embodiment, the reliability and the warpage endurance of the multilayer ceramic electronic component against the cost of the multilayer ceramic electronic component as well as the moistureproof reliability and the mounting reliability may be secured.

The first and second conductive resin layers 131b and 132b may be exposed through and extend across the holes in the first and second plating layers 131c and 132c, respectively. Therefore, durability of the multilayer ceramic electronic component according to an exemplary embodiment against external physical impact or warpage impact of the multilayer ceramic electronic component 100 may not be substantially deteriorated.

Meanwhile, in the multilayer ceramic electronic component according to an exemplary embodiment, the moistureproof reliability and the mounting reliability as well as the reliability and the warpage endurance of the multilayer ceramic electronic component against the cost of the multilayer ceramic electronic component may be secured by optimizing a thickness of each of the first and second base electrode layers 131a and 132a illustrated in FIGS. 1 through 3 instead of the first and second plating layers 131c and 132c.

The reason is that each of the first and second base electrode layers 131a and 132a may also have a thickness deviation due to fluidity and viscosity in a process of being formed, similar to the thickness deviation of each of the first and second plating layers 131c and 132c.

That is, the first and second base electrode layers 131a and 132a may have one or more to three or less holes positioned at one or more to three or less of eight points of the first and second base electrode layers 131a and 132a closest to the eight corners including corners P1, P1-2, P1-3, and P1-4 of the ceramic body 110. For example, holes may occur at points adjacent to, aligned with, or overlapping with the eight corners including corners P1, P1-2, P1-3, and P1-4. For instance, holes in close proximity to the eight corners including corners P1, P1-2, P1-3, and P1-4 may occur, such as holes disposed at a distance from a respective corner that is less than 10%, less than 5%, or less than 2% of a length of a side of the body of the multilayer component. The holes may overlap with or include the corners, such that corners are exposed through the holes Meanwhile, in the multilayer ceramic electronic component according to an exemplary embodiment, the thickness of each of the first and second external electrodes 131 and 132 may further be decreased and the moistureproof reliability and the mounting reliability may be secured by optimizing both of the thickness of the first and second plating layers 131c and 132c and the thickness of each of the first and second base electrode layers 131a and 132a.

That is, some of the eight corners including corners P1, P1-2, P1-3, and P1-4 of the ceramic body 110 may be exposed through holes of the first and second external electrodes 131 and 132.

Here, the first and second tin plating layers 131d and 132d may cover the holes through which the ceramic body 110 is exposed. Depending on a design, the first and second conductive resin layers 131b and 132b may additionally cover the holes through which the ceramic body 110 is exposed.

Figure 5:
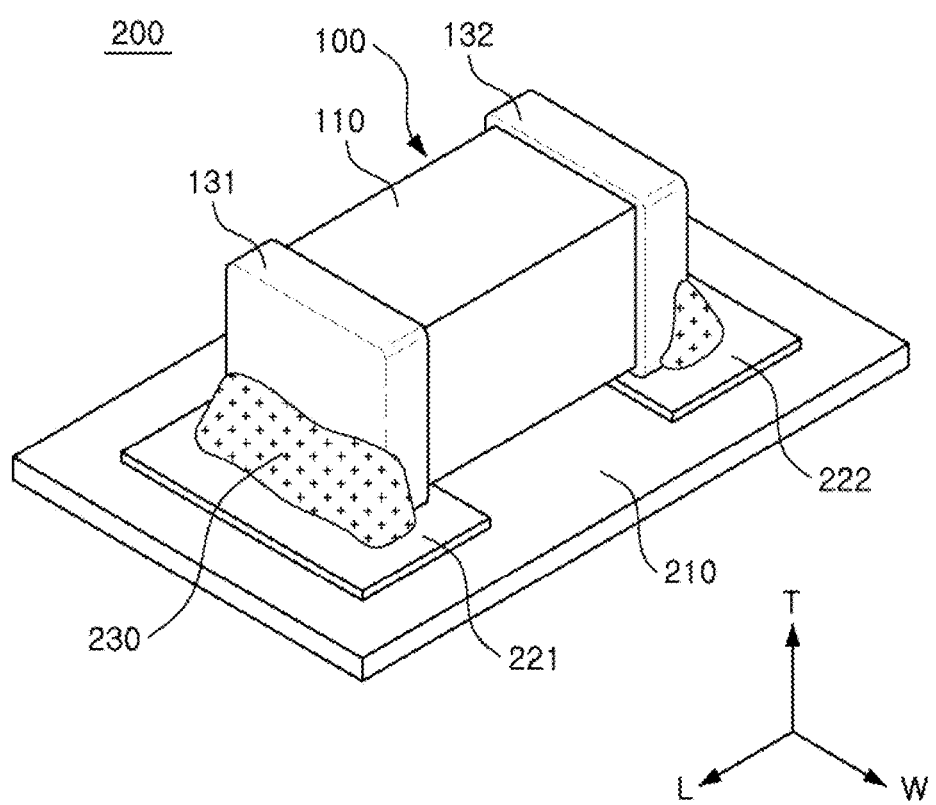
FIG. 5 is a perspective view illustrating a multilayer ceramic electronic component according to an exemplary embodiment that is mounted on a board.

FIG. 5 is a perspective view illustrating an assembly 200 in which the multilayer ceramic electronic component according to an exemplary embodiment is mounted to a board.

Referring to FIG. 5, the multilayer ceramic electronic component 100 according to an exemplary embodiment may include first and second solders 230 connected, respectively, to the first and second external electrodes 131 and 132 to be electrically connected to a board 210.

For example, the board 210 may include first and second electrode pads 221 and 222, and the first and second solders 230 may be disposed on the first and second electrode pads 221 and 222, respectively.

When corners of the ceramic body 110 are round, the first and second solders 230 may be filled in surplus spaces depending on the round corners of the ceramic body 110.

The first and second solders 230 may be more closely coupled to the first and second external electrodes 131 and 132, respectively, in a reflow process, and the multilayer ceramic electronic component 100 according to an exemplary embodiment may not only have the first and second external electrodes 131 and 132 that are relatively thin, but may also have the mounting reliability, such that a disconnection of the first and second solders 230 in the reflow process may be prevented.

Figure 6A:
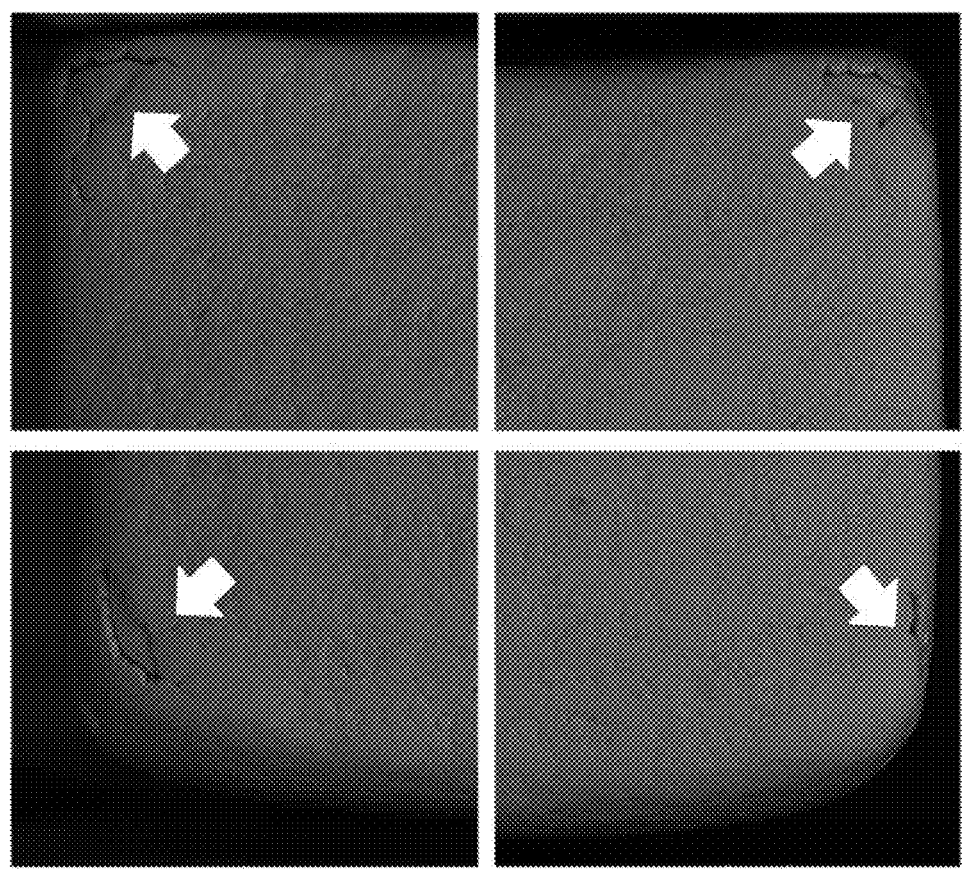
FIG. 6A shows images, captured by a scanning electron microscope (SEM), of a multilayer ceramic electronic component that has holes disposed at corners.
Figure 6B:
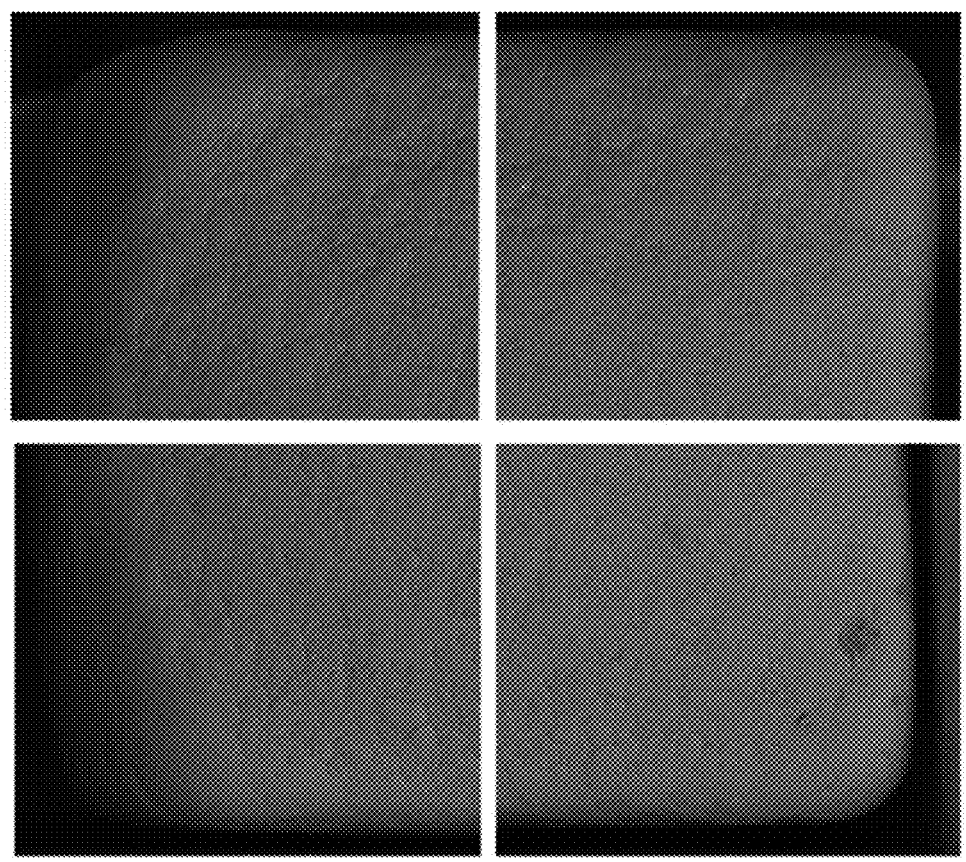
FIG. 6B shows images, captured by an SEM, of a multilayer ceramic electronic component that does not have holes disposed at corners.

FIG. 6A shows images, captured by a scanning electron microscope (SEM), of a multilayer ceramic electronic component that has holes disposed at corners and extending through an external electrode. In contrast, FIG. 6B shows images, captured by an SEM, of a multilayer ceramic electronic component that does not have holes extending through all layers of an external electrode at corners thereof.

As set forth above, in the multilayer ceramic electronic component according to an exemplary embodiment, the thickness of the external electrode may be decreased and deterioration of moistureproof reliability and a mounting defective rate of the external electrode may be substantially suppressed, by optimizing the number of holes of the plating layer and/or the base electrode layer.

While exemplary embodiments have been shown and described above, it will be apparent to those skilled in the art that modifications and variations could be made without departing from the scope of the present invention as defined by the appended claims.

What is claimed is:

1. A multilayer ceramic electronic component comprising:
a ceramic body including dielectric layers and first and second internal electrodes alternately stacked in a thickness direction and respectively exposed to opposing end surfaces of the ceramic body with each of the dielectric layers interposed therebetween; and
first and second external electrodes disposed on outer surfaces of the ceramic body to be connected to the first and second internal electrodes, respectively, and disposed to cover at least five of eight corners of the ceramic body,
wherein the first and second external electrodes include, respectively, first and second base electrode layers at least partially in contact with the outer surfaces of the ceramic body and first and second plating layers disposed to cover the first and second base electrode layers, respectively, and
the first and second base electrode layers cover at least one corner of the ceramic body, and have one or more to three or less holes positioned closer to one of the eight corners of the ceramic body than to the center of the ceramic body in the thickness direction and to the center of the ceramic body in the width direction.

2. The multilayer ceramic electronic component of claim 1, wherein each of the first and second internal electrodes extends in a plane extending in width and length directions, and a thickness of each of the first and second external electrodes at a center of a [width×thickness] surface is 10 μm or less.

3. The multilayer ceramic electronic component of claim 2, wherein the first and second external electrodes further include, respectively, first and second conductive resin layers disposed between the first and second base electrode layers and the first and second plating layers, respectively, and
at least one of the first and second conductive resin layers covers the holes of the first and second base electrode layers, respectively.

4. The multilayer ceramic electronic component of claim 2, wherein at least one of the first and second plating layers covers the holes of the first and second base electrode layers, respectively.

5. The multilayer ceramic electronic component of claim 2, wherein the first and second external electrodes further include, respectively, first and second tin plating layers disposed on outer surfaces of the first and second plating layers, respectively, and
each of the first and second plating layers contains nickel.

6. The multilayer ceramic electronic component of claim 2, wherein an average thickness of each dielectric layer disposed between adjacent first and second internal electrodes is 0.4 μm or less, and
an average thickness of each of the first and second internal electrodes is 0.4 μm or less.

7. A multilayer ceramic electronic component comprising:
a ceramic body including alternately stacked first and second internal electrodes with dielectric layers therebetween; and
first and second external electrodes disposed on respective opposing end surface of the ceramic body through which the first and second internal electrodes are respectively exposed, and extending on four side surfaces of the ceramic body adjacent to the opposing end surfaces,
wherein the first and second external electrodes are disposed on at least five of eight corners of the ceramic body,
each of the first and second external electrodes includes a base electrode layer in contact with the respective end surface and the four side surfaces of the ceramic body, and a plating layer covering the base electrode layer, and
at least one of the base electrode layers and the plating layers of the first and second external electrodes covers at least one corner of the ceramic body, and includes one or more and three or less holes extending therethrough, wherein the holes are positioned closer to one of the eight corners of the ceramic body than to the center of the ceramic body in the thickness direction and to the center of the ceramic body in the width direction.

8. The multilayer ceramic electronic component of claim 7, wherein the one or more and three of less holes are each disposed to include therein at least one corner of the ceramic body.

9. The multilayer ceramic electronic component of claim 7, wherein at least one of the base electrode layers and the plating layers extends across the hole disposed in the other of the base electrode layers and the plating layers.

10. The multilayer ceramic electronic component of claim 7, wherein the at least one of the base electrode layers and the plating layers having the one or more and three or less holes extending therethrough extends over at least one respective edge between adjacent outer surfaces of the ceramic body.

11. A multilayer ceramic electronic component comprising:
  a ceramic body including dielectric layers and first and second internal electrodes alternately stacked in a thickness direction and respectively exposed to opposing end surfaces of the ceramic body with each of the dielectric layers interposed therebetween; and
  first and second external electrodes disposed on outer surfaces of the ceramic body to be connected to the first and second internal electrodes, respectively, and disposed to cover at least five of eight corners of the ceramic body,
  wherein the first and second external electrodes include, respectively, first and second base electrode layers at least partially in contact with the outer surfaces of the ceramic body and first and second plating layers disposed to cover the first and second base electrode layers, respectively, and
  at least one of the first and second base electrode layers extends over at least one respective edge between adjacent outer surfaces of the ceramic body and has one or more to three or less holes positioned closer to one of the eight corners of the ceramic body than to the center of the ceramic body in the thickness direction and to the center of the ceramic body in the width direction.

12. The multilayer ceramic electronic component of claim 11, wherein each of the first and second internal electrodes extends in a plane extending in width and length directions, and a thickness of each of the first and second external electrodes at a center of a [width×thickness] surface is 10 μm or less.

13. The multilayer ceramic electronic component of claim 11, wherein the first and second external electrodes further include, respectively, first and second conductive resin layers disposed between the first and second base electrode layers and the first and second plating layers, respectively, and
  at least one of the first and second conductive resin layers covers the holes of the at least one of the first and second base electrode layers.

14. The multilayer ceramic electronic component of claim 11, wherein at least one of the first and second plating layers covers the holes of the at least one of the first and second base electrode layers.

15. The multilayer ceramic electronic component of claim 11, wherein the first and second external electrodes further include, respectively, first and second tin plating layers disposed on outer surfaces of the first and second plating layers, respectively, and
  each of the first and second plating layers contains nickel.

16. The multilayer ceramic electronic component of claim 11, wherein an average thickness of each dielectric layer disposed between adjacent first and second internal electrodes is 0.4 μm or less, and
  an average thickness of each of the first and second internal electrodes is 0.4 μm or less.

* * * * *